United States Patent [19]

Otsuka et al.

[11] Patent Number: 5,114,234
[45] Date of Patent: May 19, 1992

[54] STAGE POSITIONING CONTROL METHOD AND APPARATUS

[75] Inventors: Hiroyuki Otsuka; Kotaro Hosaka, both of Ushiku; Makoto Higomura, Yokohama, all of Japan

[73] Assignee: Canon Kabushiki Kaisha, Tokyo, Japan

[21] Appl. No.: 750,695

[22] Filed: Aug. 20, 1991

Related U.S. Application Data

[63] Continuation of Ser. No. 402,357, Sep. 5, 1989, abandoned.

[30] Foreign Application Priority Data

Sep. 5, 1988 [JP] Japan ................. 63-220484

[51] Int. Cl.⁵ .................................................. G01B 9/02
[52] U.S. Cl. ..................................... 356/358; 356/363
[58] Field of Search ............................... 356/363, 358

[56] References Cited

U.S. PATENT DOCUMENTS 3,786,332  1/1974  Hepner et al. ................. 356/363 X
4,710,865 12/1987  Higomura .
4,888,536 12/1989  Sakai et al. ..................... 318/592

Primary Examiner—Samuel A. Turner
Attorney, Agent, or Firm—Fitzpatrick, Cella, Harper & Scinto

[57] ABSTRACT

Control method and apparatus for positioning an X-ray stage which is movable in X and Y directions to move a semiconductor wafer, for example, in a stepper wherein a pattern formed in the mask is sequentially printed on the shot areas of a semiconductor wafer in a step-and-repeat manner. The X-Y stage is provided with a wafer chuck supported by means of a tilting stage to control the tilting of the wafer chuck relative to the X-Y plane. In order to detect the position of the wafer chuck in the X and Y directions, the inclination of a laser interferometer mirror provided integrally with the wafer chuck relative to the X-Y plane can be detected. By this, when a positioning error for the X-Y stage occurs due to the Abbe length, in the Z direction, between the wafer supporting surface of the wafer chuck and the point in the mirror at which the laser beam from the laser interferometer is incident and due to the pitching and rolling of the X-Y stage, the error is detected on the basis of the attitude change by the movement of the X-Y stage, and is corrected.

7 Claims, 3 Drawing Sheets

STAGE POSITIONING CONTROL METHOD AND APPARATUS

This application is a continuation of application Ser. No. 07/402,357 filed Sep. 5, 1989, now abandoned.

FIELD OF THE INVENTION AND RELATED ART

The present invention relates to a stage positioning control method and apparatus, and more particularly to a positioning control method and apparatus usable with a so-called stepper wherein a pattern formed in a mask or reticle is transferred onto each shot area on a semiconductor wafer in a step-and-repeat manner to control positioning of an X-Y stage movable in X and Y directions.

In the X-Y stage for moving the semiconductor wafer in the X and Y directions in the stepper, it is conventional that the position of the semiconductor wafer is detected using a laser light wave interferometer (laser interferometer). In the laser interferometer system, a mirror is integrally mounted on the wafer chuck on the X-Y stage, and a laser beam is reflected by the mirror. The stage controller positions the stage on the basis of the result of detection by the laser interferometer.

In such a system, the positioning accuracy of the X-Y stage can be degraded due to a so-called Abbe error which results from a combination of an Abbe length, measured in the Z direction perpendicular to the X-Y plane, between the position (the position to be detected) at which the laser beam is incident on the laser interferometer mirror and the position (the position to be controlled) at which the wafer is supported by the wafer chuck and pitching and rolling of the X-Y stage. Conventionally however, the accuracy degradation can be negligible, or some measure is taken to reduce the Abbe length in the stage structure.

SUMMARY OF THE INVENTION

However, the recent demand for the extremely accurate positioning is not met by the conventional system. In addition, in the case where the wafer chuck is moved in six directions, more particularly, the directions along X, Y and Z axes and the rotational directions about X, Y and Z axes, the following problems arise even if the apparatus structure is improved by, for example, reducing the Abbe length and improving the rectilinearlity of the X, Y and Z axes movement:

(1) In order to provide the high precision, the precisions of the stage mechanisms have to be increased in order to enhance the rectilinearlity of the stage movements, with the result that the cost is increased and the structure becomes complicated: and (2) The ambience conditions of the stage have to be extremely closely controlled.

Accordingly, it is a principal object of the present invention to provide a stage positioning control method and apparatus which are very precise.

It is another object of the present invention to provide a stage positioning control method and apparatus wherein the cost of the apparatus can be decreased, and the structure is less complicated, and wherein the precise positioning is possible without very closely controlled ambient conditions.

According to an aspect of the present invention, there is provided a stage positioning correction and control method, wherein an attitude (pose) of the stage before the positioning and the attitude after the positioning are detected, and on the basis of the difference in the attitudes therebetween, the Abbe error resulting from the tilting of the stage is corrected.

According to another aspect of the present invention, there is provided a stage positioning correction and control apparatus, comprising position detecting means in the form of a laser interferometer or the like for the positioning of a stage, attitude change detecting means for detecting an attitude difference between the detected position and at the controlled position, in the form of, for example, a position sensor, a collimator, a tilt sensor using a laser interferometer or the like, and correcting means for correcting an Abbe error resulting from the tilting of the stage due to the difference between the attitude of the stage before the positioning and the attitude after the positioning.

According to the method and the apparatus, the amount of pitching at the detecting position on the stage can be known, and an amount of the pitching difference provided by the positioning movement of the stage can be known. On the basis of the difference, the attitude of the stage can be known by a predetermined sequential operation.

By doing so, the part of the positioning error due to the Abbe error can be removed. Thus, the accuracy which has conventionally been guaranteed only under the condition that the stage moves rectilinearly, can be improved.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Preferred embodiments of the present invention will be described, taking as an example a stage for moving the semiconductor wafer in the X and Y directions in a stepper wherein a pattern formed on the mask or reticle is sequentially transferred or printed onto shot areas of a semiconductor wafer in a step-and-repeat manner.

Figure 1:
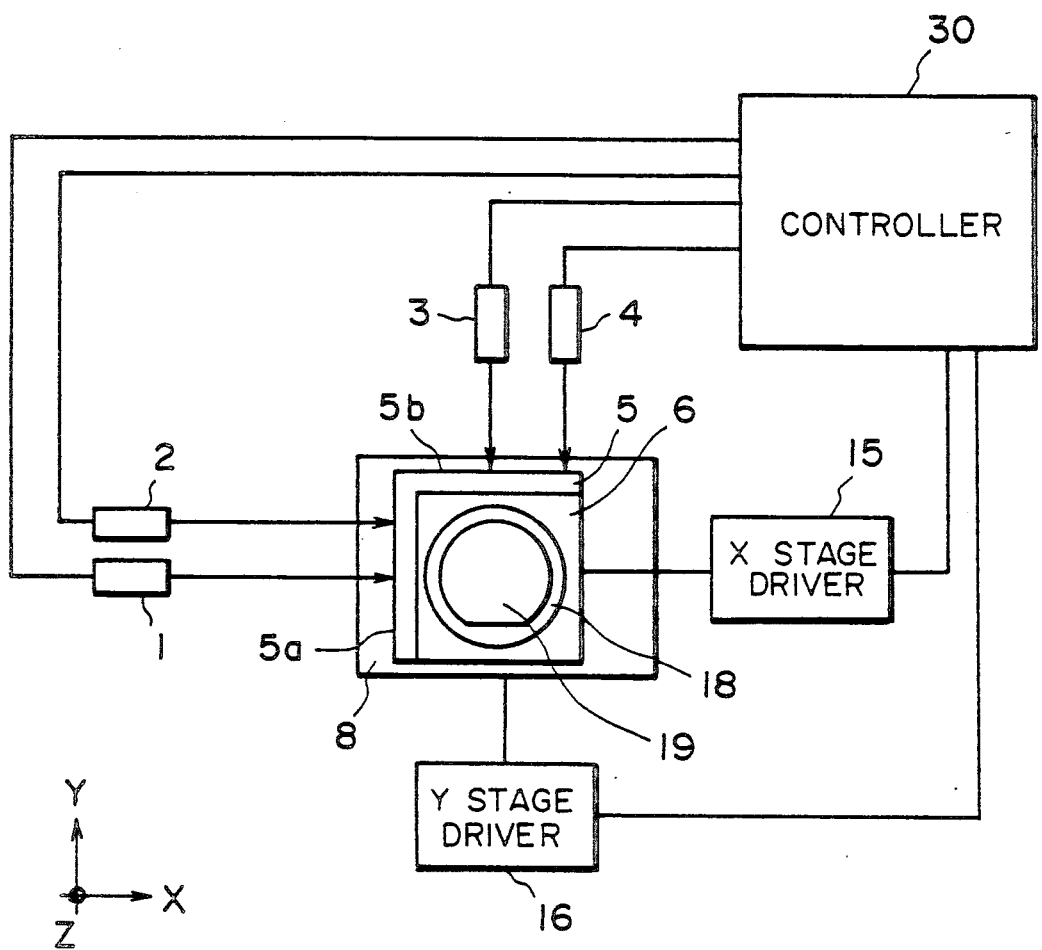
FIG. 1 is a top plan view of a stage positioning apparatus usable with the stage positioning control method and apparatus using a laser interferometer for detecting a pitching component, according to an embodiment of the present invention.
Figure 2:
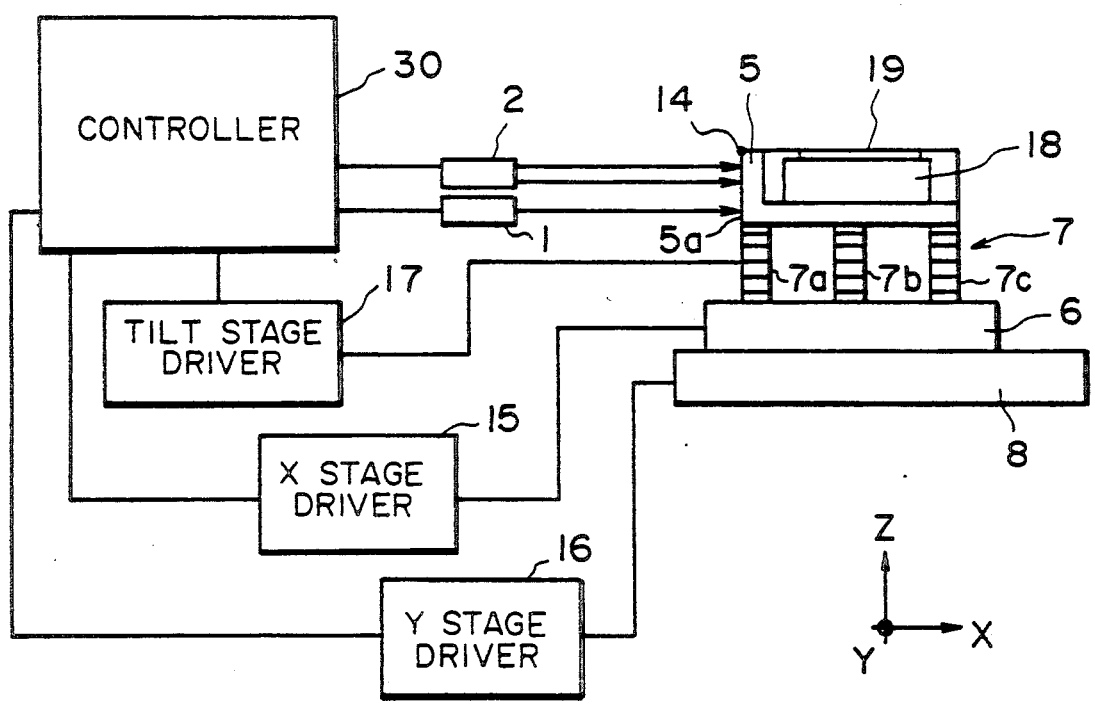
FIG. 2 is a side view of the apparatus of FIG. 1, wherein the positioning of the laser interferometer for detecting the pitching component is shown in detail.
Figure 3:
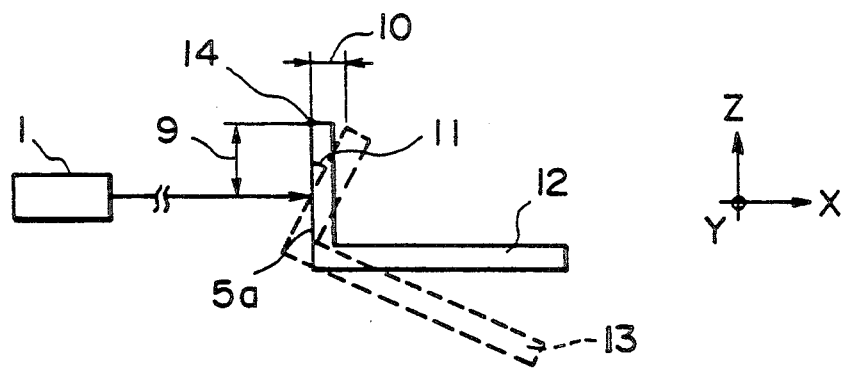
FIG. 3 shows in an enlarged scale only the laser interferometer mirror producing an Abbe error in a stage positioning operation, and it best shows the principle of the present invention.

Referring to FIGS. 1-3, there is shown a control system according to this embodiment which comprises a laser interferometer 1 for an X-axis, a distance detecting laser interferometer for determining an X-axis pitching component (rotational component about the Y-axis), a distance detecting laser interferometer 3 for a Y-axis, a distance detecting laser interferometer 4 for detecting a Y-axis pitching component (rotational component about the X-axis). A laser beam emitted from each of the laser interferometers is reflected by a laser interferometer mirror 5. The mirror 5 includes a reflecting surface 5a substantially parallel to the Y-Z plane for reflecting the laser beam from the laser interferometer 1 and 2 and a reflecting surface 5b substantially parallel to an X-Z plane reflecting the laser beam from each of the laser interferometers 3 and 4.

As shown in FIG. 2, the interferometers 2 and 4 emit laser beams, respectively, to the mirror 5 which is spaced apart therefrom in the Z-direction. From the detections provided by the reflected beams, the attitude of the reflecting surface 5a in the rotational direction about the Y-axis, and the attitude of the reflecting surface 5b in the rotational direction about the X-axis, can be obtained.

The stepper comprises an X-stage 6, a tilting stage 7, a Y-stage 8 and a wafer chuck 18 for supporting a semiconductor wafer 19. The Y-stage 8 is moved along the Y-axis by Y-stage driving means 16 relative to an unshown base. Similarly, the X-stage 6 is moved along the X-axis by X-stage driving means 15 relative to the Y-stage 8. The tilting stage 7 has three stacks 7a, 7b and 7c of piezoelectric elements for moving the wafer chuck 18 in the X-axis direction relative to the X-stage 6. Each of the stacks 7a-7c are circumferentially and equidistantly spaced about the wafer chuck 18 in the X-Y plane. By making different the driving amounts the respective stacks, the wafer supporting surface on the wafer chuck 18 can be tilted relative to the X-Y plane. In addition, the wafer chuck 18 is moved in the Z-direction.

The laser interferometer mirror 5 is integrally formed on the wafer chuck 18, and therefore, is inclined integrally with the wafer chuck 18 relative to the X-stage 6 by the tilting stage 7. The tilting stage 7 is given by tilting stage driving means 17. Each of the driving means 15, 16 and 17 are controlled on the basis of instructions by a controller 30. The controller 30 also processes the detection by the interferometers 1, 2, 3 and 4, and also controls the entire stage system.

In FIG. 3, a reference numeral 14 designates a position to be controlled (control point), that is, the object of the actual control, which is substantially the same as the top surface of the semiconductor wafer 19 supported on the wafer chuck 18, in the Z direction. The distance, measured in the Z direction, between the control point 14 and a point in the mirror at which the laser beam from the laser interferometer is incident on the reflecting surface 5a, is the so-called Abbe length 9. The attitude of the mirror 5 before start of the stages 6 and 8 movements is designated by a reference 12, whereas the attitude of the mirror 5 which is taken after movements of the stages 6 and 8, and therefore, which involves a tilt changes due to the pitching of the stage 6 and the rolling of the stage 8 resulting from the movement. The Abbe error in the X-axis direction resulting from the tilt change is designated by a reference 10. A reference numeral 11 designates a tilt angle representing a difference in the X axis direction between the mirror attitude 12 before the start of movements of the stages 6 and 8 and the mirror attitude 13 after the movements of the stages 6 and 8. The same thing applies to the Y-axis direction, and the description thereof is omitted for simplicity.

When the stages 6 and 8 are positioned in the X and Y directions, the Abbe error 10 is produced in the X-axis direction due to the pitching of the X-stage 6 and the rolling of the Y-stage 8; both are rotational components in the Y-axis. As regard the Y-axis direction, the similar Abbe error is produced due to the pitching of the Y-stage 8 and the rolling of the X-stage 6; both are rotational components about the X-axis. Since the Abbe length 9 is known, the amount or degree of the Abbe error 10 can be obtained by multiplying the Abbe length 9 by the tilt angle 11 of the reflecting surface 5a detected by the pitching component detecting laser interferometer 2, in the X-axis direction. The same applies to the Y-axis direction.

Figure 4:
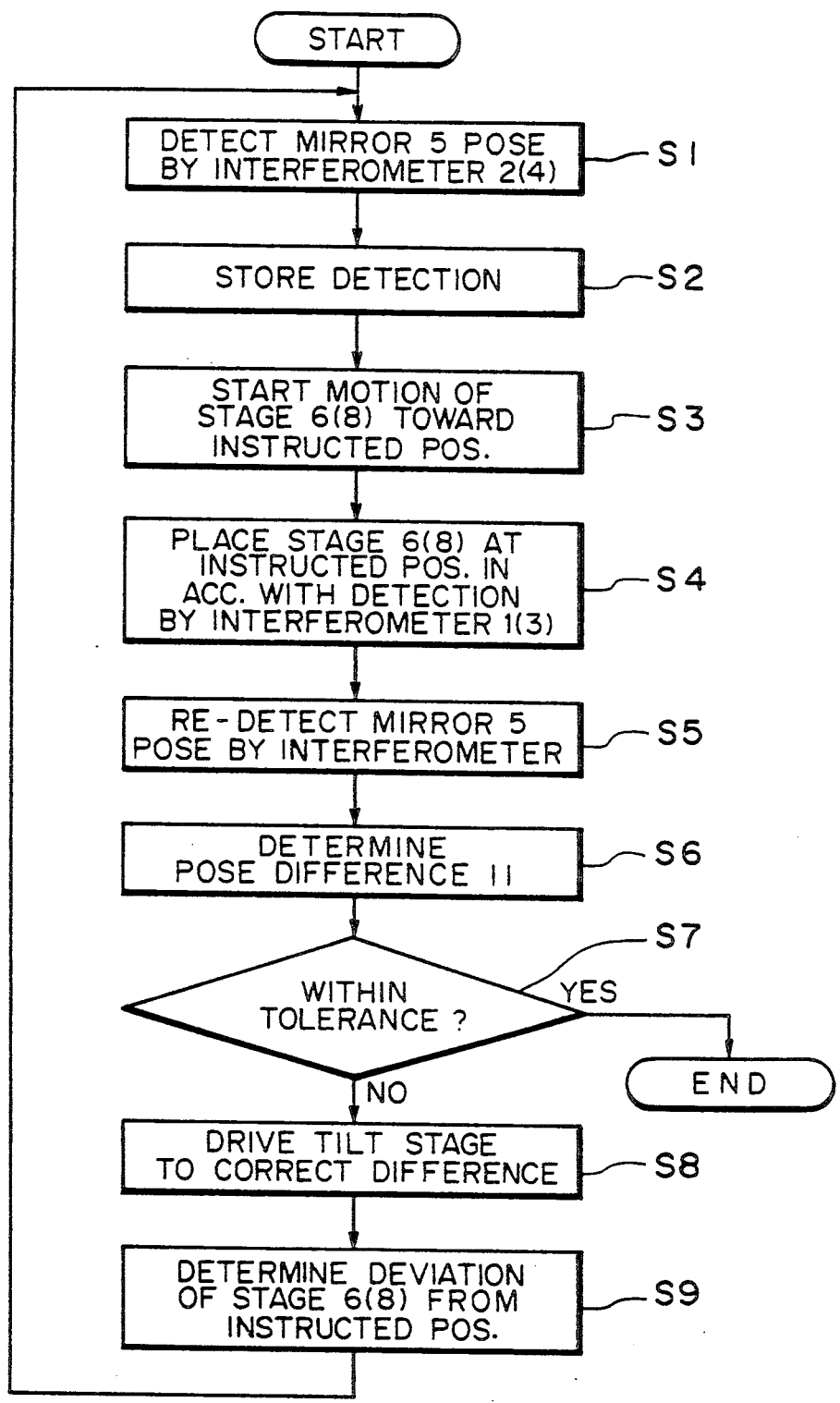
FIG. 4 is a flow chart showing the control sequence of the apparatus according to this embodiment.

FIG. 4 is a flow chart showing the positioning correction and control in this embodiment.

First, at step S1, the interferometer 2 (4) detects the attitude 12 of the reflecting surface 5a (5b) of the mirror 5, and therefore, of the wafer chuck 18. The detection is stored in a memory in the controller 30 at step S2. Thereafter, the controller 30 instructs at step S3 the X and Y stage driving means 15 and 16 the movements of the X and Y stages 6 and 8 to start movements of the X and Y stages 6 and 8. At step S4, the X and Y stage driving means 16 and 18 are controlled on the basis of the detections of the laser interferometers 1 and 3 for detecting the X and Y positions of the wafer chuck 18, so that the positions of the X and Y stages 6 and 8 detected by the laser interferometers 1 and 3 correspond to the instructed positions.

Subsequently, at step S5, the attitude 13 of the reflecting surface 5a (5b) of the mirror 5 is detected again by the laser interferometer 2 (4), and at step S6, a tilt angle 11 which is an attitude difference of the reflecting surface 5a (5b) between before and after the stages 6 and 8 movements is calculated from the detected attitude 13 and the attitude 12 stored at step S2. At step S7, the discrimination is made as to whether or not the attitude difference (tilt angle) 11 is within a predetermined tolerance. If so, that is, if the tilt difference between the detection point of the reflecting surface 5a (5b) at which the laser beam from the interferometer (3) is incident and at the control point 14 is negligibly small, the positioning by the X and Y stages 6 and 8 is terminated.

On the other hand, the attitude difference 11 is outside the tolerance, the sequence goes to step S8, where the controller 30 instructs the tilting stage driving means 17 to correct the tilting stage 7 by the amount of the attitude difference 11 In response to this, the tilting stage driving means 17 tilts integrally the wafer chuck 18 and the mirror 5 by the tilting stage 7 to return the attitude of the mirror 5 to the attitude 12 from the attitude 13. It is considered that this tilting changes the detection by the interferometer 1 (3). Therefore, the controller 30, thereafter, that is, at step S9, calculates the difference (deviation) of the detection by the interferometer 1 (3) relative to the instructed position. Then, the operation returns to step 1 where the X and Y stages 6 and 8 are readjusted to correct the deviation Then, the same operation is repeated until the results of discrimination at step S7 becomes "YES", and then the positioning of the X and Y stages 6 and 8 are completed.

In this embodiment, the attitude difference of the mirror 5 is detected by the laser interferometers 2 and 4. In an alternative arrangement, a position sensor is mounted on a member and at such a position that it is integrally moved with the mirror 5, and the change in the position at which the laser beam is incident is detected, by which the attitude change is detected. As a further alternative, a known collimator may be used for this detection.

As described in the foregoing, according to the present invention, an Abbe error resulting from the existence of the Abbe length is corrected on the basis of the attitude change of the stage by the positioning movement thereof, and therefore, the manufacturing cost and the time period required for the manufacturing of the apparatus having a high degree of precision, can be reduced, and in addition, the high precision positioning can be realized without severe limitation to the ambient conditions.

While the invention has been described with reference to the structures disclosed herein, it is not confined to the details set forth and this application is intended to cover such modifications or changes as may come within the purposes of the improvements or the scope of the following claims.

What is claimed is:

1. A stage positioning control method, comprising the steps of:
    detecting an attitude of a laser interferometer mirror disposed on a linearly movable stage by means of a tilting stage to provide a first detected attitude;
    projecting a laser beam onto the laser interferometer mirror;
    controlling a linear position of the stage using the laser beam projected onto the laser interferometer mirror;
    detecting again the attitude of the laser interferometer mirror after the positioning of the linearly movable stage to provide a second detected attitude;
    determining a difference between the first detection attitude and the second detection attitude; and
    controlling the tilting stage on the basis of the difference in order to correct an Abbe error.

2. A method according to claim 1, wherein the step of controlling the tilting stage is performed on the basis of the attitude difference when it is outside a predetermined tolerance.

3. A method according to claim 2, wherein after the step of controlling the tilting stage is performed on the basis of the attitude difference, the step of controlling the linearly movable stage using the laser beam is executed again.

4. A stage positioning control apparatus, comprising:
    an X-Y stage linearly movable along an X-Y plane;
    a laser interferometer, including a mirror, for projecting a laser beam onto said mirror and for detecting a positioning of said stage in the X-Y plane;
    a tilting stage for securing said mirror to said X-Y stage and for adjusting the inclination between said mirror for said laser interferometer and the X-Y plane;
    means for determining a change of an attitude of said mirror as the result of a movement of said X-Y stage; and
    a controller for controlling said tilting stage in accordance with the determined change.

5. An apparatus according to claim 4, wherein said determining means comprises a laser interferometer.

6. A method for moving a semiconductor wafer for sequentially processing plural areas of a semiconductor wafer, said method using a wafer chuck provided with a mirror movable integrally therewith and comprising the steps of:
    placing the semiconductor wafer in a wafer chuck, said chuck being supported by means of a tilting stage disposed on a linearly movable stage;
    detecting the attitude of a surface of said mirror to obtain a first detected attitude;
    controlling a position of the wafer chuck by the linearly movable stage using a light beam reflected by the mirror surface;
    detecting again the attitude of the mirror surface to obtain a second detected attitude; and
    controlling movement of the tilting stage in accordance with the first and second detection attitudes.

7. A method according to claim 6, wherein a change in the attitude of the mirror surface is detected in accordance with the first and second detected attitudes, and the movement of the tilting stage is effective to correct the position change.

* * * * *

UNITED STATES PATENT AND TRADEMARK OFFICE
CERTIFICATE OF CORRECTION

PATENT NO. : 5,114,234
DATED : May 19, 1992
INVENTOR(S) : HIROYUKI OTSUKA, ET AL.

It is certified that error appears in the above-identified patent and that said Letters Patent is hereby corrected as shown below:

COLUMN 1:

Line 52, "rectilinearlity" should read --rectilinearity--.

COLUMN 3:

Line  2, "ometer . mirror" should read --ometer mirror--.
    Line 25, "are" should read --is--.
    Line 37, "are" should read --is--.
    Line 54, "a" should be deleted.

COLUMN 4:

Line 42, "the" (2nd occurrence) should read --if the--.
    Line 46, "difference 11" should read --difference 11.--.

COLUMN 6:

line 27, change "the" to --a--.

Signed and Sealed this

Twenty-first Day of September, 1993

Attest:

BRUCE LEHMAN

Attesting Officer      Commissioner of Patents and Trademarks